United States Patent [19]

Duval et al.

[11] 4,112,505
[45] Sep. 5, 1978

[54] READ-ONLY-MEMORY WITH SHUNT PATH TO DIVERT PROGRAMMING CURRENT

[75] Inventors: Jean-Claude Duval, Le Perreux; Francis Joseph Mottini, Eaubonne; Serge Auguste Touron, Bagnolet; Jean-Jacques Francois Rennard, Sartrouville; Ruchela Marie Duval, Le Perreux, all of France

[73] Assignee: Compagnie Internationale pour l'Informatique Cii-Honeywell Bull, Paris, France

[21] Appl. No.: 746,435

[22] Filed: Dec. 1, 1976

[30] Foreign Application Priority Data

Dec. 5, 1975 [FR] France .................................. 75 37358

[51] Int. Cl.² ............................................... G11C 17/00
[52] U.S. Cl. ..................................................... 365/96
[58] Field of Search .................... 340/173 SP; 365/94, 365/96, 104

[56] References Cited

U.S. PATENT DOCUMENTS 3,872,450   3/1975   Reynolds .................... 340/173 SP

*Primary Examiner*—Stuart N. Recker
*Attorney, Agent, or Firm*—Lowe, King, Price & Markva

[57] ABSTRACT

An integrated circuit programmable read only memory is arranged in a matrix having a plurality of memory cells arranged in rows and columns. A particular cell in a matrix is addressed by selecting the appropriate row and column. A destructible memory element connects a column to a row at each intersection. The currents for programming adjacent memory cells corresponding to a row of the memory are diverted by a single path.

11 Claims, 5 Drawing Figures

READ-ONLY-MEMORY WITH SHUNT PATH TO DIVERT PROGRAMMING CURRENT

FIELD OF THE INVENTION

The present invention relates to read-only memories of the type employed in computers, wherein a matrix network includes conductive wires and semiconductor bands, and more particularly to a read-only memory employing a single shunt path for programming currents applied to each intersection of wires and bands.

BACKGROUND OF THE INVENTION

A read-only memory is a matrix network forming a grid having rows forming selected words and columns forming binary units or bits of the words. The correspondence of the bits to a given word is determined by memory elements which link the row for the word to the bit columns. The memory elements are arranged at intersections of the grid forming the memory in such a way that the arrangement is fixed.

When read-only memories are being manufactured, all the intersections are sometimes provided with destructible linking elements so that it is subsequently possible for the user to create a suitable pattern of links in the matrix network of the memory by destroying certain of the linking elements of the network. A programming operation is thereby performed and the memory is termed programmable.

Destructible memory elements may be divided into two categories: those which initially form a conductive link between the rows and the columns and can be destroyed by a current overload, these being for instance elements made of a fusible material which create an open circuit when they are destroyed; and those which initially create a barrier to any linking, such as diodes which are intended to be reverse biased and which can be destroyed by causing them to break under a current or voltage overload, after which they form short circuits when the memories are in normal use. Consequently, broadly speaking, programming consists in applying an electrical overload to an element to be destroyed by selecting the word row and bit column to which the element is connected. The conductors in the matrix network therefore must carry this overload without substantial loss so that the complete destruction of the selected memory element is assured to prevent the overload from being too small. Too small an overload may occur with certain memories which are integrated into semiconductor substrates, in which the rows, for example, are formed by doping bands within the substrate. These bands are mutually parallel straight lines of relatively greater resistance than metal wires which intersect with them and are applied to the substrate on a dielectric layer to form the columns of the matrix network of the memory. These columns are connected to the bands by the destructible linking elements.

To avoid losses in the resistive rows when programming integrated read-only memories, one solution is to provide the read-only memory with shunt paths which are good conductors and are intended to divert the programming currents flowing in the resistive bands formed in the semiconductor substrate. The shunt paths are connected to the bands by semiconductor structures whose conductive state is controlled by applying a control potential to the band to which the memory element to be destroyed corresponds.

In this way, the programming current of the designated wire passes through the controlled conduction semiconductor structure and returns along the appropriate shunt path, which may be a metal wire similar to the metal wires forming the columns of the read-only memory. The aforementioned structure is formed by four layers of alternating conductivity types, these layers being arranged within the semiconductor bands forming the rows of the memory.

The semiconductor material of these bands may be used as the material of one layer of the structure, namely the layer which acts as the control electrode or gate which actuates the structure into a conducting state. When the destructible element is a diode formed by two semiconductor layers of opposite conductivity, one of which is connected to a bit wire, the other layer may take the place of one of the four layers of the controlled conduction structure.

In such a structure, if the memory contains P columns, there are at least P/2 shunt paths for the programming currents. The presence of a large number of shunt paths complicates the structure of the memory and, when the memory is of a given size, prevents the accommodation of a large number of rows and columns. An example of such a structure is described in British Pat. No. 1440167.

BRIEF DESCRIPTION OF THE INVENTION

In accordance with one aspect of the invention, a read-only memory that is programmable by selectively applying programming currents to destructible memory elements comprises a matrix of M rows and B columns. The rows are mutually parallel, linear, resistive bands, while the columns are mutually parallel, highly conductive wires. Thereby, intersections $M_aB_b$ exist between the rows and columns, where $a = 1, 2 \ldots M$ and $b = 1, 2 \ldots B$. A destructible memory element connects the columns and rows at each of the intersections. A single shunt path is provided from column $B_b$ through the element at intersection $M_aB_b$ to row $M_a$ for a programming current applied to column $B_b$.

Preferably, the shunt path includes a switch means at each of the intersections $M_aB_b$. The switch means includes a control electrode responsive to the potential of row $M_a$ to control the flow of current through input and output electrodes of the switch means. The input electrode is connected in parallel to elements $M_aB_b$ and to the output electrode of the switch means at intersection $M_aB_{b+1}$. The output electrode of the switch means at intersection $M_aB_b$ is connected to supply current only to the input electrode of the switch means at intersection $M_aB_{b-1}$, except for the first column where $b = 1$. The switch means at intersection $M_aB_1$ is connected to a control electrode of another switch means that has input and output electrodes connected between a segment of row $M_a$ adjacent column 1 and a reference potential. Thereby, in response to a programming current flowing through the element at intersection $M_aB_b$, the switch means at intersections $M_aB_b$, $M_aB_{b-1}$ ... $M_aB_1$ are all closed to supply a forward biasing current to the another switch means, which in turn provides a low impedance shunt path between the row segment adjacent column 1 and the reference potential.

Preferably, the read-only memory of the present invention is formed on a semiconductor substrate, whereby the word rows are resistive semiconductor bands in the substrate and the bit columns are conductive wires which are applied to the substrate and electrically insulated from the semiconductor bands by a dielectric layer. The switching means at each intersection are preferably bipolar transistors of a first conductivity type that are formed in a substrate, while the other switching means are bipolar transistors of a second conductivity type. The input and output electrodes of both types of switch means are formed by the emitter and collector electrodes of the bipolar transistors. The emitter electrodes of the transistors forming the another switches are connected to a conductive wire that is parallel to the conductive wires forming the columns and is insulated from the semiconductor bands by the dielectric layer. Hence, the present invention enables the structure of integrated circuit read-only memories to be simplified by diverting the currents for programming N adjacent memory elements corresponding to the row of the memory into a single path. The resulting structural simplification enables a higher density of memory elements to be achieved, and consequently enables the area of the silicon substrate required to produce the memory to be reduced. Thus, the cost of manufacturing the memory is also reduced.

It is, accordingly, an object of the present invention to provide a new and improved programmable read-only memory including destructible memory elements.

Another object of the invention is to provide a new and improved integrated circuit, programmable read-only memory having a high density of memory elements.

A further object of the invention is to provide a new and improved, relatively inexpensive programmable read-only memory including destructible memory elements.

The invention has as another object a new and improved programmable read-only memory which is formed from integrated circuits on a semiconductor substrate. This memory is chiefly characterized by a single shunt path for the currents that program N memory elements connecting one row of the memory to N adjoining columns of P columns included in the memory.

The features and advantages of the memory will be more clearly apparent from the following circuit arrangements, which are described solely by way of example and are illustrated in the accompanying drawings.

DETAILED DESCRIPTION OF THE DRAWING

Figure 1:
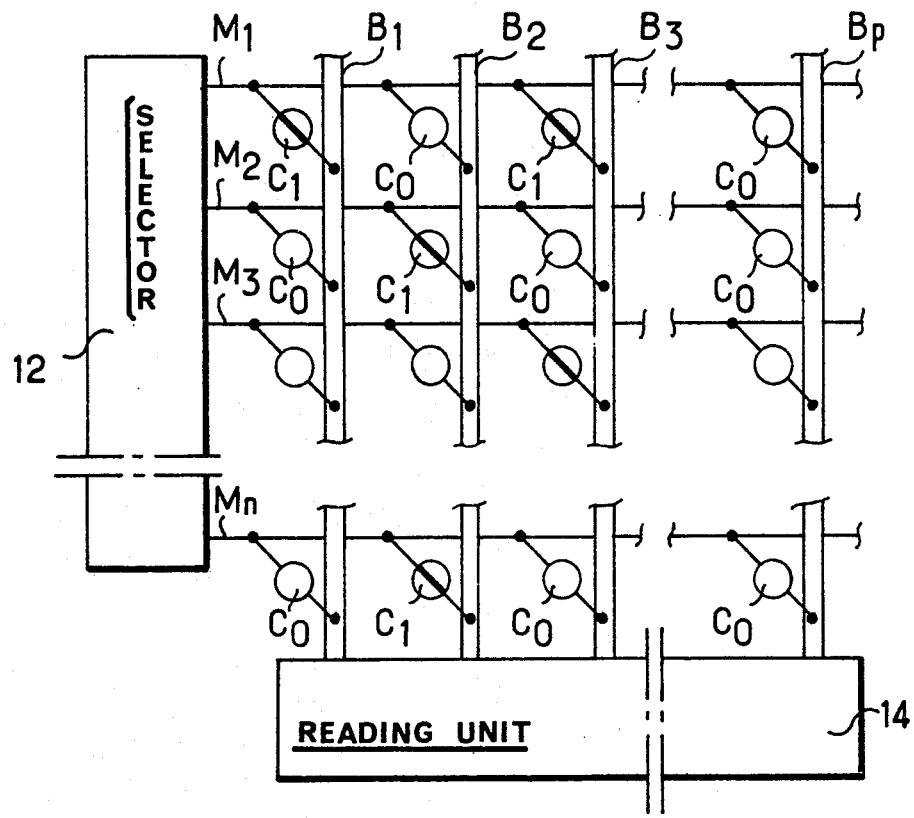
FIG. 1 is a circuit diagram of a read-only memory programmed for one particular case.

In FIG. 1, there is shown a previously programmed read-only memory 10. Memory 10 includes a network of word rows M1, M2 ... Mn and bit columns B1, B2 ... Bp. Each row selectively communicates with each column via a separate memory or destructable linking element C; elements C, at each intersection between the rows and columns are referenced either C1 or C0 depending upon whether the element does or does not provide a connection between the rows and the columns. All of the word rows are connected to a selector 12 for selecting $n$ words while all the columns are coupled to a reading unit 14 formed by $p$ bit readers.

Initially, read-only memory 10 is capable of being programmed since each intersection initially has destructible linking element C. If each of the linking elements originally constitutes a conductive connection C1, programming involves destroying certain elements C0 so that the desired pattern of conductive elements remains intact after programming.

Figure 2:
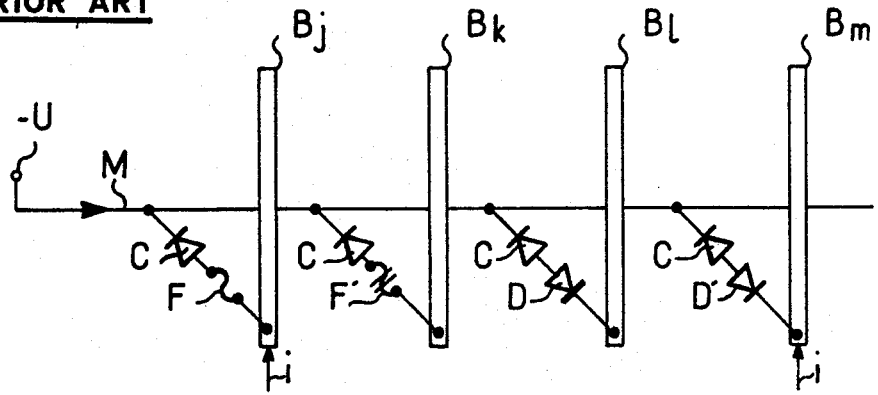
FIG. 2 is a partial circuit diagram of examples of prior art linking elements used in programmable memories.

The destructible linking element is generally a fusible substance F (FIG. 2) which conducts a current $i$ from a bit column, e.g., column Bj, when a voltage $-u$ is applied to the appropriate word row M. Once a particular element is destroyed (as indicated by F') the particular word row M is isolated from the corresponding bit column Bk.

It is also possible for all the linking elements C in the programmable read-only memory to be initially isolating elements when the matrix is in its final manufactured state. In such a case, all of elements C are originally unconductive (in state C0) and programming involves activating certain of the elements so that they are conductive (in state C1). Thus, the initial linking element C0 may be a reverse biased diode, such as the diode D in FIG. 2, which connects word row M to column B1. It is seen infra how diode D is activated to be a conductive connection similar to connection D', which conducts between word row M and bit column Bm. Each destructible linking element is generally associated with a diode C which allows a current $i$ to flow in only one direction and thus prevents any unwanted diversion of the programming and normal operating currents. Diode C should not be destroyed during programming.

Figure 3:
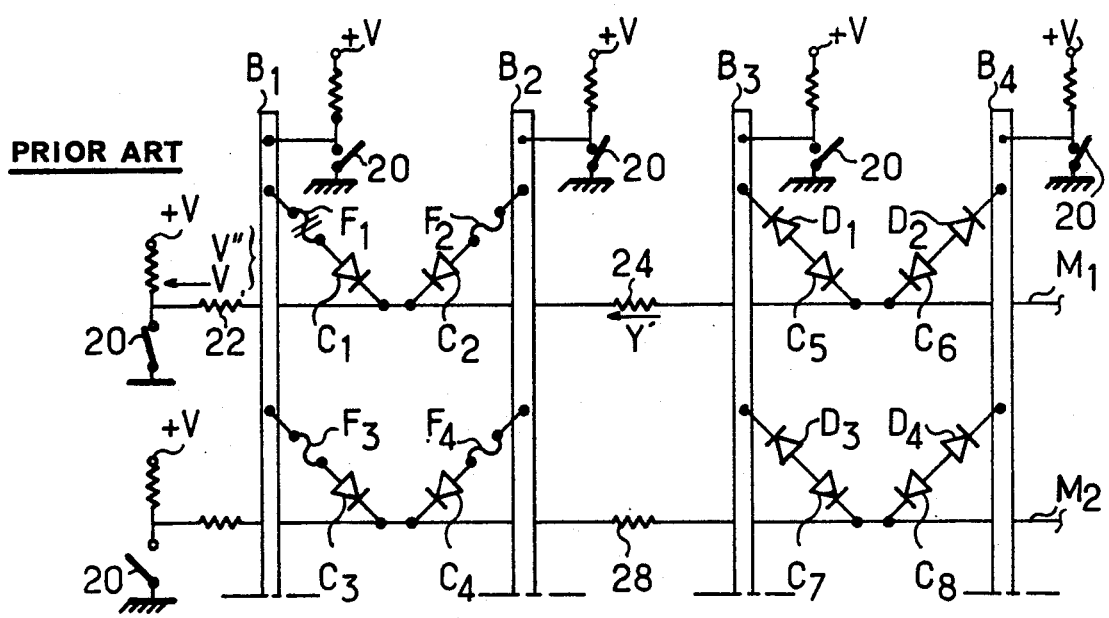
FIGS. 3 and 4 are circuit diagrams of various prior art integrated read-only memories.

A prior art programming circuit and method is illustrated in FIG. 3 wherein each of the two word rows M1 and M2 and the four bit columns B1, B2, B3 and B4 is connected to a predetermined plus D.C. power supply terminal (at voltage +V) that is selectively grounded by closure of a separate shunt switch 20. In addition, word row M1 is respectively connected to columns B1 and B2 by fusible members F1 and F2 and is respectively connected to columns B3 and B4 by diodes D1 and D2, in the same way as word row M2 is connected to columns B1 and B2 via fusible members F3 and F4 and to bit columns B3 and B4 via diodes D3 and D4.

Word row M1 is set to ground potential by closure of the switch connected to row M1 and column B1 is at a potential of +V, since switch 20 connected to column B1 is open. These potentials cause fusible member F1 to carry a current having a level that melts the fusible material and breaks the electrical connection. Conversely, since bit column B2 is at the ground potential, ground potential is applied to both terminals of fusible member F2 and the latter remains intact. The same is true of fusible member F3 since both of its terminals are at a potential of +V. Diode C4 prevents current from flowing in fusible member F4; if diode C4 had not been included, current would have flown through member F4 since one end of member F4 would have a potential of +V applied to it from row M2 and the other end of member F4 would have ground potential applied to it from bit column B2.

Since bit column B3 and B4 are respectively at potential +V and the ground potential, diode D1 is reverse biased and, depending on the nature and level of potential +V, may be damaged. Diodes D2 and D3 remain intact since both the electrodes thereof are at the same potential. On the other hand, diode D4 would be forward biased if there were no diode C8, since diode C8 is designed to withstand the difference of potential between row M2 and column B4. Diode D4 is protected in this way and remains intact.

It is now assumed that columns B1-B4 are perfect conductors but that rows M1 and M2 are resistive so that the resistance per unit length thereof is indicated in FIG. 3 by resistors 22, 24, 26 and 28. If only fusible member F1 is to be destroyed, switches 20 respectively connected to column B1 and row M1 are respectively opened and closed, whereby the column and row respectively have voltages of +V and 0 at their ends and a programming current flows through member F1 to cause a potential drop +$v$ to exist across resistor 22. Similarly, if bit column B3 has a potential of +V, the current flowing through diode D1 causes a potential drop +$v'$ across resistor 24 and a potential drop of $v''$ across resistor 22. Consequently, depending on the resistance of the rows and the strength of the currents which flow through them, the power applied to the linking elements to be destroyed may be less than the minimum required to destroy them. This is something which occurs in particular when programming integrated read-only memories which are formed both on and in a semiconductor substrate. In effect, as will become more clearly apparent below with reference to FIG. 5, the rows (or columns) are resistive semiconductor bands formed by doping the semiconductor substrate and the columns (or rows) are generally metal wires which are good conductors of electricity which are applied to the substrate. In view of the resistivity of the semiconductor bands, integrated circuit read-only memories may prove difficult to program.

Figure 4:
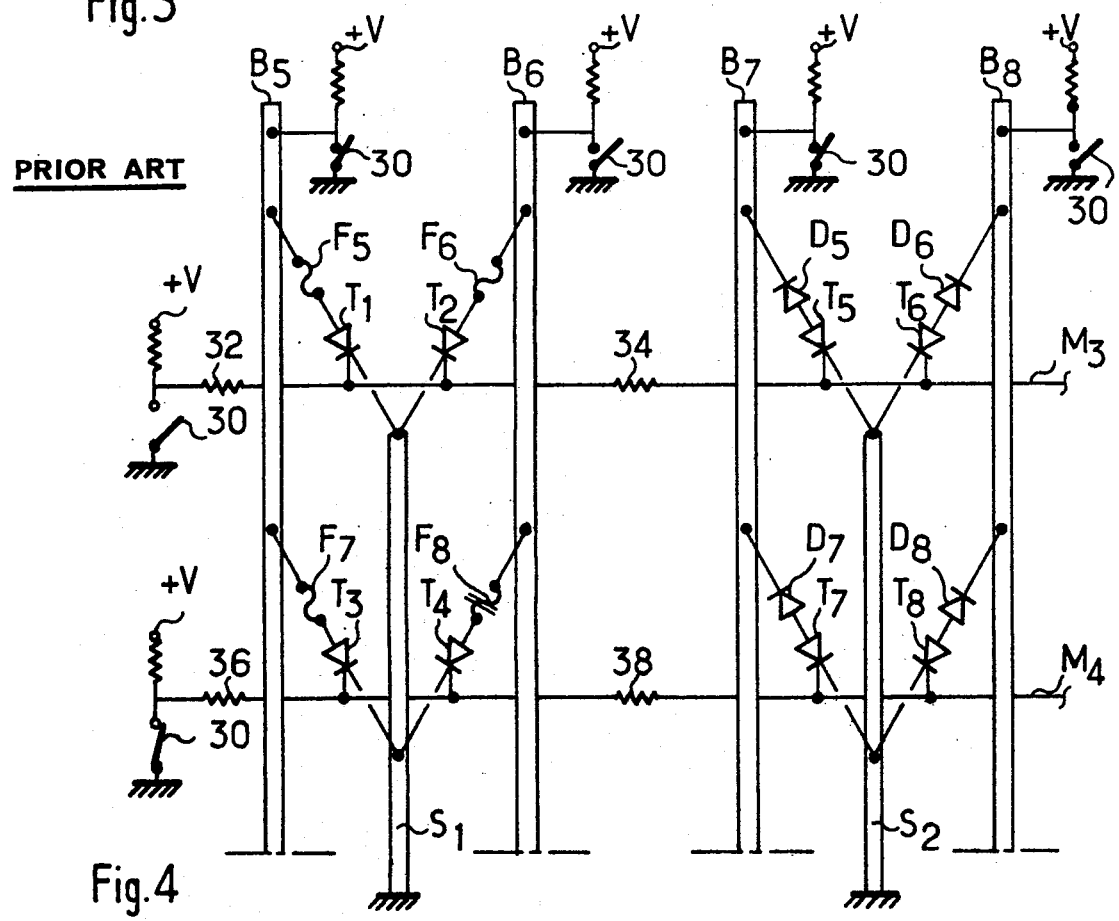

The integrated circuit read-only memory shown in FIG. 4 enables the aforementioned problems to be overcome by having a large number of shunt paths for the programming current. In FIG. 4 are two word rows M3 and M4 and four bit columns B5, B6, B7 and B8, each of which is connected to a switch member 30 identical to the members 20 in FIG. 3. Row M3 and columns B6 and B8 are at a potential of +V, while row M4 and columns B5 and B7 are at the reference potential. In the present example, columns B5 to B8 are perfect conductors, whereas rows M3 and M4 exhibit a certain amount of resistance per unit length, as represented by resistors 32, 34, 36 and 38. As in FIG. 3, bit columns B5 and B6 have fusible members F5 to F8 as linking elements while bit columns B7 and B8 have diodes D5 and D8 as linking elements.

The memory of FIG. 4 includes shunt paths S1 and S2 which are formed from a conductive material such as that constituting columns B and the shunt paths lie parallel to these columns. The shunt paths are connected to ground potential during programming. There is one shunt path, such as path S1, for each pair for adjacent columns, such as columns B5 and B6.

The memory also incorporates controlled-conduction semiconductor structures T1 to T8 which may consist of four superimposed layers of alternating conductivity types with a control layer forming a gate of the structure. Such a structure thus operates as a thyristor. The anode-cathode path of each of thyristors T1 to T4 is connected between a respective one of the fusible members F5 to F8 to shunt path S1, with the gate, which in the present case is an interior layer forming a grid for the anode, being connected to the word row to which the linking element corresponds. The same is true of thyristors T5 to T8 in relation to diodes D5 to D8, which are associated with shunt path S2.

The programming of the read-only memory of FIG. 4 will now be described. In the case of fusible member F5, and similarly in the case of diode D5, the gates of corresponding thyristors T1 and T5 have a voltage of +V, whereas the anode-to-cathode voltage of these thyristors is zero. Thus, no current flows through them and linking elements F5 and D5 remain intact during programming. Thyristors T2 and T6, which correspond respectively to fusible member F6 and diode D6 since their gates are at the same potential +V as their anodes, are not triggered so that linking elements F6 and D6 remain intact. All of the electrodes of thyristors T3 and T7 which respectively correspond to linking elements F7 and D7 are at ground potential. Consequently, no current flows through elements F7 and D7 and they remain intact during programming.

The gates and anodes of thyristors T4 and T8 are respectively at ground potential and a potential of +V with respect to their cathodes. Thyristors T4 and T8 are thus triggered and a current from columns B6 and B8 flows through and destroys linking elements F8 and D8 before returning to ground through shunt paths S1 and S2. Thus, the programming current travels through shunt paths S1 and S2, which are good conductors, and destroys the linking elements through which it passes. This being the case, the function of the rows is merely to trigger the selected thyristor by supplying it with a gate current.

When the programming has been completed, there is a junction present between the gates and anodes of thyristors T1 – T8. Thus, programmed short circuit connections exist between selected intersections of the columns and rows, either via the undestroyed fusible members F5 – F7 or via diode D8 which has been destroyed. Under these circumstances, no currents flow through the other junctions of the thyristors by isolating paths S1 and S2 or holding paths S1 and S2 at the same potential as the bit columns.

Figure 5:
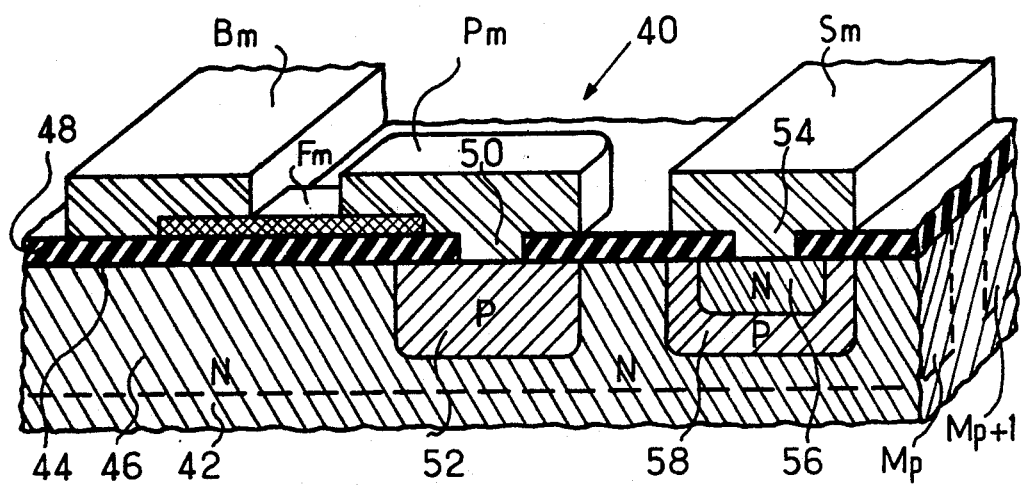
FIG. 5 is an enlarged cross-sectional prospective view of a read-only memory integrated onto a semiconductor substrate, such as the one shown in FIG. 4, in which the number of shunt paths is at least equal to half the number of columns in the memory.

In FIG. 5 is illustrated an embodiment of a prior art integrated circuit read-only memory of the type partly illustrated in FIG. 4. The memory of FIG. 5 is a case where the linking element is a fusible member.

Section 40 of the read-only memory illustrated in FIG. 5 is formed from a substrate 42 composed of a semiconductor material, such as silicon. Mutually parallel, isolated, N type conductivity, semiconductor bands 46, representing word rows $Mp$, $Mp + 1$, (which are equivalent to word rows M3 and M4 as illustrated in FIGS. 3 and 4) are grown epitaxially on substrate 42 of material 46. Perpendicular to these bands, wires (e.g., wire $Bm$) of a high, electrical conductivity metal, such as aluminum, are applied to substrate 42 and are electrically insulated therefrom by a dielectric layer 48 of silica, for example. Only one conducting wire B$m$ appears in the Figure, to form the column of the memory in serial position $m$. At the intersection between bit column B$m$ and word row M$p$ is shown a destructible linking element, which in this case is fusible member F$m$. Fusible member F$m$ is connected to word row M$p$ by metal contact P$m$ which penetrates through opening 50 in dielectric layer 48. At opening 50 there is formed in the material 46 constituting word row M$p$, a semiconductor region 52 of P type conductivity.

Corresponding to at least one bit column is a shunt path for the programming current, as shown by paths 51 and 52 in FIG. 4. In FIG. 5, bit column B$m$ has corresponding to it a shunt path S$m$ which, is formed from a highly conductive material and lies on substrate 42 parallel to the adjoining bit columns; thus path S$n$ is of the same form and physical make-up as the memory columns. These shunt paths are connected to the intersections along lines M$p$, M$p$+1 through openings 54 formed in the dielectric layer 48. At the points where openings 54 are situated, N and P doped semiconductor regions 56 and 58 are formed within M$p$ band 46, with region 56 enclosed within region 58 and being in contact with the shunt path S$m$.

Region 52, the space in M$p$ band 46 between regions 52 and 58, region 58, and region 56 form a semiconductor structure consisting of four superimposed layers of alternating types of conductivity whose conductive state can be controlled. This structure is thus comparable to a thyristor in which the layer forming the control grid or gate is contained between regions 52 and 58 and is composed of the substance 46 of N type conductivity which forms word row M$p$. By programming memory 40 using the potentials described with reference to FIG. 4, the region 52 connected to the fusible member F$m$ forms the anode of the thyristor and region 56 forms its cathode, in the same way as is shown diagrammatically in FIG. 4.

Figure 6:
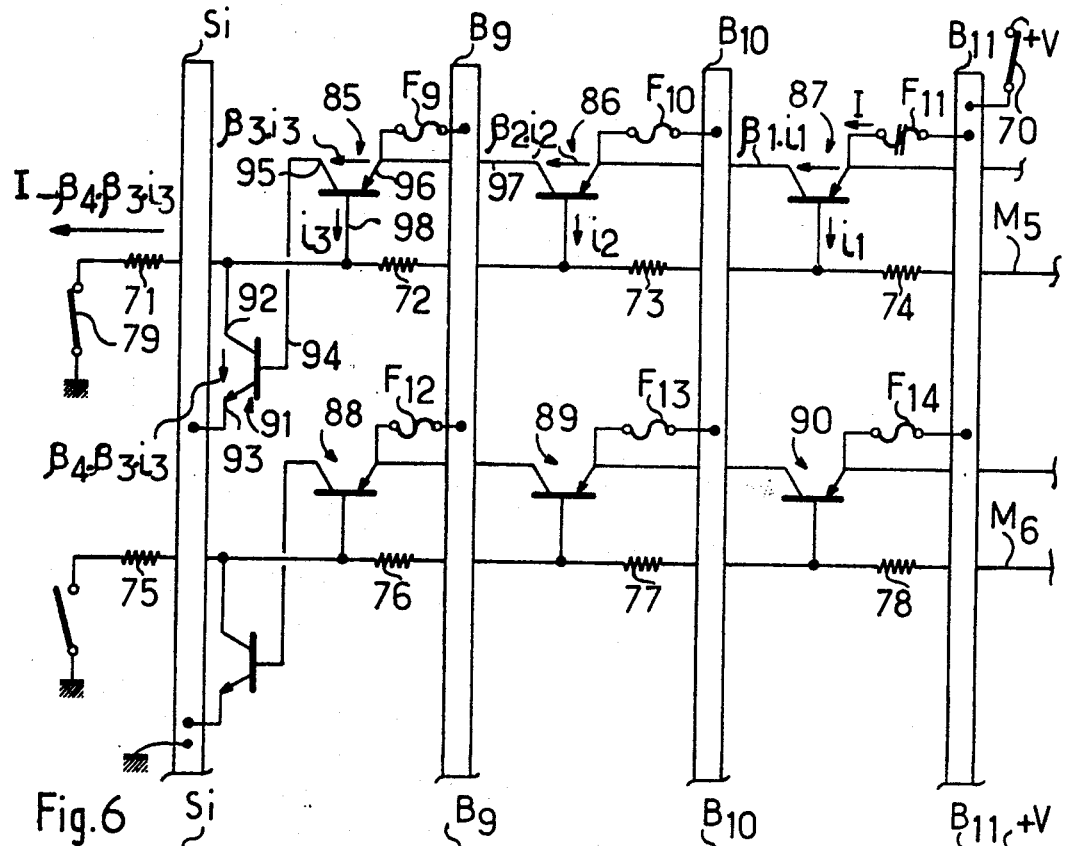
FIG. 6 is a circuit diagram of an embodiment of an integrated circuit read-only memory according to the invention, wherein the memory elements are fusible members.
Figure 7:
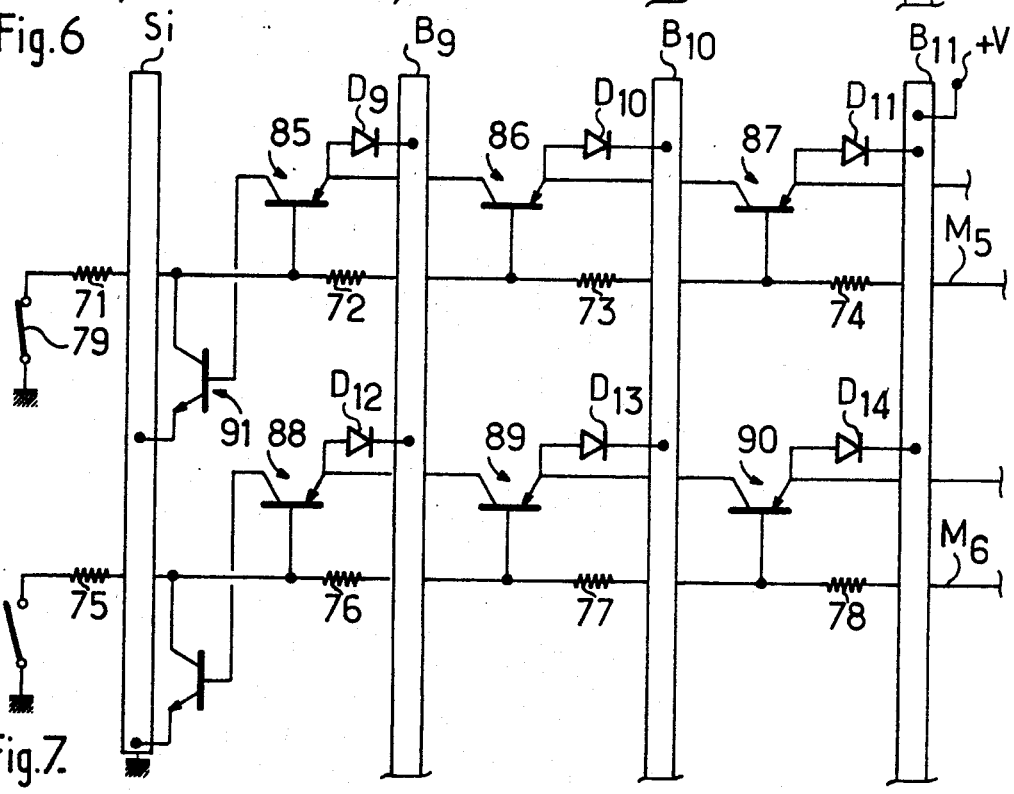
FIG. 7 is a circuit diagram of another embodiment of an integrated circuit read-only memory according to the invention wherein the memory elements are diodes.

Two embodiments of a read-only memory according to the invention are shown in FIGS. 6 and 7; the linking elements being fusible members in FIG. 6 and diodes in FIG. 7.

Referring to FIG. 6, two word rows M5 and M6 and three bit columns B9, B10 and B11 are shown by way of example. Column B11 is at a potential of +V while row M5 is connected to ground potential. Columns B9 and B10 and row M6 float, as they are connected neither to the potential +V nor to ground potential.

In the present example, columns B9, B10 and B11 are substantially perfect conductors, whereas rows M5 and M6 exhibit a resistance per unit length represented by resistors 71 to 78. Columns B9, B10 and B11 and rows M5 and M6 have fusible members F9 to F14 and PNP type transistors 85 to 90 as linking elements; the emitter collector paths of transistors 87-85 and 90-88 are series connected with each other and are selectively shunted to ground only by the connections of the bases of transistors 87-85 to row M5 or by the connections of the bases of transistors 90-88 to row M6. A shunt path for all of columns B9, B10 and B11, in the case of row M5 for example, is formed by a NPN type transistor 91 connected to a grounded metal return-path conductor S$i$. Collector 92 and emitter 93 of transistor 91 are respectively connected to row M5 and the ground potential of column S$i$. Base 94 of shunt transistor 91 is connected to collector 95 of the first linking transistor 85 which corresponds to column B9 of the memory.

The emitter of each linking transistor, except for the linking transistors connected to the column farthest from column S$i$, is connected in parallel to the appropriate fusible member, and to the collector of the next linking transistor. The base of each linking transistor is connected to the corresponding row. Hence, e.g., emitter 96 and base 98 of transistor 85 are respectively connected in parallel to member F9 and collector 97 of transistor 86 and to row M5. The linking transistors connected to the column farthest from column S$i$ are connected only to fusible members.

The semiconductor structures which appear in this embodiment of an integrated read-only memory according to the invention are thus transistor structures containing three superimposed layers of alternating conductivity types, employing PNP linking transistors and NPN shunt transistors.

The method of programming the read-only memory of FIG. 6 will now be described by assuming that member F11 is to be destroyed. Switches 70 and 79 are closed so that fusible member F11 has the potential +V applied to it and the base of each linking transistor 85, 86 and 87 of row M5 is forward biased by being connected to ground potential via line resistances 71 to 74. In response to these voltages, currents $i1$, $i2$ and $i3$, respectively flow through the bases of transistors 87, 86 and 85 so that a current path is provided from column B11 through element F11 and the emitter collector paths of transistors 87, 86 and 85 to base 94 of shunt transistor 91; this current path is shunted only to connections of the bases of transistors 87, 86 and 85 to row M5. The current supplied by collector 95 to base 94 of transistor 91 forward biases transistor 91 to provide a low impedance shunt path from the common connection of resistances 71 and 72 through the emitter collector of transistor 91 to column S$i$ and ground. If the dynamic current gains of transistors 87, 86 and 85 are respectively $\beta1$, $\beta2$ and $\beta3$, the currents at the collectors of the transistors 87, 86 and 85 are respectively $\beta1 \cdot i1$, $\beta2 \cdot i2$ and $\beta3 \cdot i3$. Thus, if $\beta4$ is the dynamic current gain of shunt transistor 91, the current at the collector of this transistor 91 is $\beta4 \cdot \beta3 \cdot i3$. Since the total current supplied to transistors 85-87 and 91 is the current (I) in fusible member F11, the current through last line resistance 71 is $I - \beta4 \cdot \beta3 \cdot i3$.

It can thus be seen that the current through the last line resistance, and through all the other line resistances is very small and that the overvoltages at the ends of the resistances are also very small. The short circuit at the terminals of fusible member F11 therefore takes place under favorable conditions for the destruction of this fusible member. Once fusible member F11 has been destroyed, the programming is over for the intersection at row M5 and column B11 and the same operation can then be performed on a memory element at the intersection of another row or another column, or of the same row and another column, or at another row and the same column, since all these elements have remained intact.

Refer now to FIG. 7, wherein there is illustrated an integrated read-only memory according to the invention in which the memory elements are reverse biased diodes D9 to D14. Since the programming of this memory takes place in the same way as in the case where the memory elements are fusible members, the present memory and its programming will not be described in detail. Similar items bear the same reference numerals in both FIGS. 6 and 7.

Figure 8:
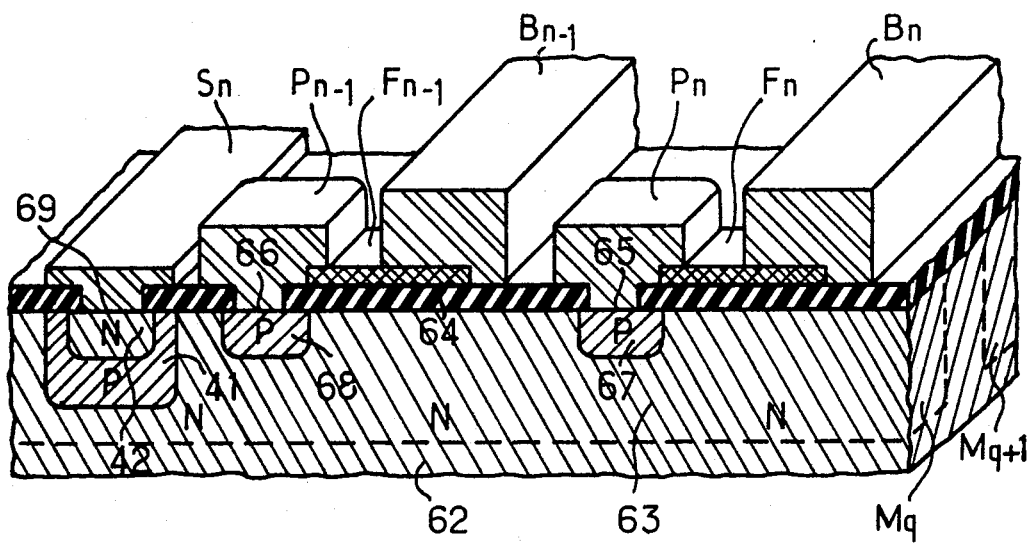
FIGS. 8 and 9 are respectively enlarged cross sectional prospective views of the integrated circuit memory structures of FIGS. 6 and 7, as formed on semiconductor substrates.

There will now be described, with reference to FIG. 8, the structure of the memory of FIG. 6, when integrated onto a semiconductor substrate. The section of memory which is shown is formed from a substrate 62 comprising a semiconductor material, such as silicon, and by so-called epitaxial growth of a semiconductor material 63 doped with N type impurities on the substrate 62. By isolating linear bands within this material there are formed mutually parallel bands Mq, Mq+1 which comprise the word rows previously described with reference to FIG. 5. Perpendicular to bands Mq, Mq+1, wires Bn, Bn−1 of a high electrical conductivity are applied to the substrate while remaining electrically insulated from it by dielectric layer 64, for example, of silica. At the intersections of bit columns Bn and Bn−1 and word row Mq, are destructible linking elements, in the present case fusible members Fn and Fn−1. Fusible members Fn and Fn−1 are connected to word row Mq by metal contacts Pn and Pn−1 which project through openings 65 and 66 of dielectric layer 64. In openings 65 and 66 are respectively formed P type semiconductor regions 67 and 68 which are enclosed in the material 63 of which word row Mq is composed. Disposed parallel to bit columns Bn, Bn−1 is a shunt path Sn for the programming current which corresponds, for example, to emitter 93 of transistor 91, FIG. 6. Shunt path Sn is formed on substrate 62 and is connected to rows Mq and Mq+1 through openings 69 formed in the insulating layer 64. At each of the openings 69 and within N type material 63 forming the word rows Mq and Mq+1 are formed P and N type semiconductor regions 41, 42; region 42 is enclosed in region 41 and contacts shunt path Sn.

A structure consisting of three semiconductor layers of alternating conductivity types, comparable to a PNP type transistor, is formed by P type region 67, the space in N type material 63 separating regions 67 and 68, and P type region 68. The emitter of this transistor is formed by P type conductivity layer 67, the base is formed by the N type conductivity space between layers 67 and 68, and the collector is formed by P type conductivity layer 68. Layer 68 also forms the emitter of the PNP type transistor connected to column Bn−1. The base and emitter of this latter transistor are formed respectively by the space in N type material 63 between P type layers 41 and 68 and by layer 51. The structure formed by layers 42, 41 and 63 are the emitter, base and collector respectively of shunt transistor 91 of FIG. 6.

Figure 9:
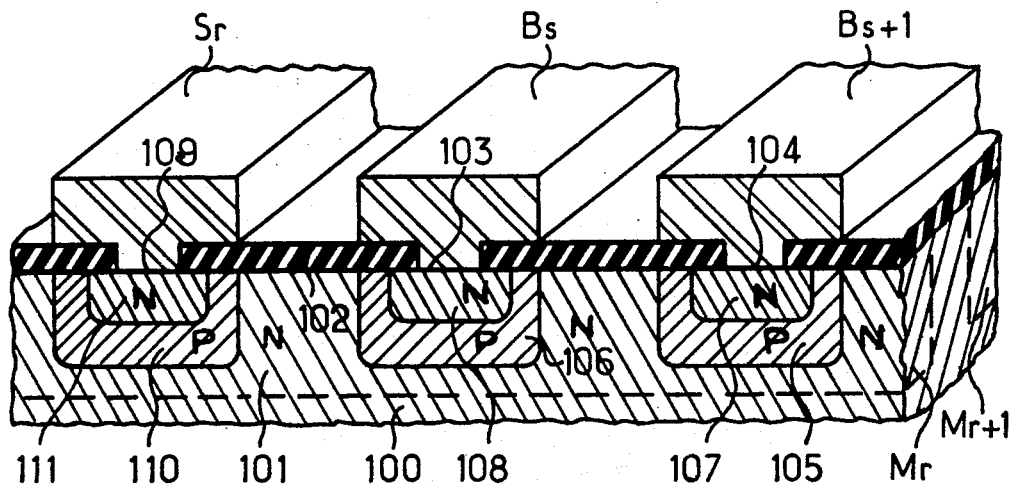

There will now be described, with reference to FIG. 9, the integrated circuit memory having the circuit diagram shown in FIG. 7. FIG. 9 is a perspective view of a section of read-only memory which is integrated onto a semiconductor substrate 100, such as silicon. As in FIG. 8, only two rows Mr and Mr+1 of the memory are shown. These rows are N conductivity type semiconductor bands 101 which are formed by epitaxial growth from the substrate 100 and are isolated from each other. In the case of the bit columns, only columns Bs and Bs+1 are shown; columns Bs and Bs+1 respectively represent serial positions S and S+1. Columns Bs and Bs+1 are formed from a high electrical conductivity metallic material and are insulated from substrate 100 by dielectric layer 102, of silica for example. At the intersections between rows Mr, Mr+1 and columns Bs, Bs+1, openings 103 and 104 are formed in dielectric layer 102 to allow contact to be made between the rows and columns. The diodes D9 and D14 of FIG. 7 are produced by P doping semiconductor regions 105 and 106 contained within the N type material constituting the bands 101 forming word rows Mr, Mr+1 and by N doping regions 107 and 108 which are enclosed in regions 105 and 106.

In accordance with the invention, the read-only memory also contains a single shunt path Sr that forms transistor 91, FIG. 7 and is associated with bit columns Bs, Bs+1. The physical make-up off path Sr is the same as that of columns Bs, Bs+1; path Sr is connected by P type region 110 and N type region 111 (region 111 being enclosed in region 110) to word rows Mr, Mr+1 which it crosses via opening 109 formed in insulating layer 102. The semiconductor structure which has just been described is a structure comprising three layers of opposing types of conductivity associated with a structure of two opposing types of conductivity. The three layer structure is formed by P type region 105, the N type space in material 101 contained between region 105 and 106, and P type space in material 101 contained between regions 105 and 106, and P type region 106, which represent a transistor such as 86 in FIG. 7. The structure formed by P type region 106, the N type space in material 101 contained between regions 106 and 110 and P type region 110 represents, for example, transistor 85 of FIG. 7.

N type regions 107 and 108 contained within P type regions 105 and 106 form, in conjunction with the latter, diodes which are employed as memory elements. These for example may be the diodes D9 and D10 of FIG. 7.

Finally, the last structure in contact with shunt path Sr, which is formed by regions 101, 110 and 111, which are of N, P and N type conductivity respectively, represents the shunt transistor 71 of FIG. 7.

The structures of the read-only memories according to the invention are thus simpler than the structures of prior art memories, which is of considerable advantage as far as their manufacture is concerned. In addition, by having only one shunt path for the programming currents for a set of N columns of the memory allows a memory of given size to have a larger number of usable columns and thus to have a much greater memory capacity for the same, given size.

It is clear that the means which have just been described in the embodiments of integrated circuit read-only memories according to the invention could be replaced by equivalent means which perform the same technical functions.

What is claimed is:

1. An integrated circuit read-only memory formed on a semiconductor substrate programmable by selectively applying programming currents to destructable memory elements comprising:
   (a) word rows of mutually parallel, linear resistive semiconductor bands in the substrate,
   (b) bit columns of N mutually parallel conductive wires which cross the bands at intersections;
   (c) an insulating layer on said substrate separating said bands and wires;
   (d) destructible memory elements for connecting a band to a wire at each of the intersections whereby a group of N of said elements connect a word row to the N wires; and
   (e) a single shunt path for diverting programming current applied to each group of N memory elements connecting a word row to the N wires, the shunt path diverting the programming currents from a portion of the semiconductor band in each row.

2. The memory of claim 1 wherein the single shunt path comprises a transistor for each of the N wires intersecting with a word row, whereby transistors $M_A$, $M_{A+1}$, ..., are respectively provided along a single word row for wires $W_A$, $W_{A+1}$, ..., where A is selectively every value from 1 through (N−1), transistor $M_A$ having a base connected to the band for the single word and an emitter connected via a memory element to the wire $W_A$ and a collector connected to the emitter collector path of transistor $M_{A+1}$; for each band, a single shunt transistor having: a base connected to be selectively forward biased by current flowing in the collector of transistor M, an emitter adapted to be connected to a fixed reference potential and a collector connected to said band.

3. The memory of claim 1 wherein each shunt path is connected to a corresponding band forming a word row by a controlled conduction semiconductor structure having a conductive state selectively controlled in response to a potential selectively applied to the band which corresponds to the memory element to be destroyed.

4. The memory of claim 3 wherein the controlled-conduction semiconductor structures are formed within said bands.

5. The memory of claim 4 wherein said controlled-conduction structures are structures having three superimposed layers of alternating conductivity types.

6. The memory of claim 5 wherein one of the layers of said controlled-conduction structure is formed by doped material which comprises said bands.

7. The memory of claim 6 wherein the destructible memory element is a fusible member connected to the material of the corresponding band via a layer having a conductivity type opposite from that of the doped material of said band.

8. The memory of claim 6 wherein the destructible memory element is a diode having one semiconductor region formed in the doped material comprising the bands and another semiconductor region formed in one of the three layers of said controlled-conduction structure.

9. A read-only memory programmable by selectively applying programming currents to destructible memory elements comprising a matrix of M rows and B columns, said rows being mutually parallel, linear, resistive bands, said columns being mutually parallel, highly conductive wires, whereby intersections $M_aB_b$ exist between the rows and columns, where $a = 1,2, ... M$, and $b = 1,2, ..., B$, a destructible memory element connecting the columns and rows at the intersection, and means for providing a single shunt path for diverting a programming current applied to column $B_b$ and through the element at intersection $M_aB_b$ so that the programming current flows through only through a portion of row $M_a$.

10. The memory of claim 9 wherein the shunt path includes a switch means at intersection $M_aB_b$, said switch means having a control electrode responsive to the potential of row $M_a$, said electrode controlling the flow of current through input and output electrodes of the switch means, the input electrode being connected in parallel to element $M_aB_b$ and to the output electrode of the switch means at intersection $M_aB_{b+1}$, the output electrode of the switch means at intersection $M_aB_b$ being connected to supply current only to the input electrode of the switch means at intersection $M_aB_{b-1}$, except where $b = 1$, the switch means at intersection $M_aB_1$ being connected to a control electrode of another switch means, said another switch means having input and output electrodes connected between a segment of row $M_a$ adjacent column 1 and a reference potential, whereby the another switch means provides a low impedance shunt path between the row segment and the reference potential and the switch means at intersections $M_aB_b$, $M_aB_{b-1}$ ... $M_aB_1$ are all closed in response to a programming current flowing through the element at intersection $M_aB_b$.

11. The memory of claim 9 wherein the single shunt path inclusive a further column of a highly conductive wire, and means responsive to the flow of programming current through the band of row $M_a$ for coupling the programming current in row $M_a$ to the wire of the further column.

* * * * *